United States Patent
Zheng et al.

(10) Patent No.: US 8,467,122 B2
(45) Date of Patent: Jun. 18, 2013

(54) HYBRID LASER SOURCE WITH RING-RESONATOR REFLECTOR

(75) Inventors: Xuezhe Zheng, San Diego, CA (US); Ashok V. Krishnamoorthy, San Diego, CA (US)

(73) Assignee: Oracle America, Inc., Redwood Shores, CA (US)

( * ) Notice: Subject to any disclaimer, the term of this patent is extended or adjusted under 35 U.S.C. 154(b) by 15 days.

(21) Appl. No.: 13/182,227

(22) Filed: Jul. 13, 2011

(65) Prior Publication Data

US 2013/0016423 A1   Jan. 17, 2013

(51) Int. Cl.
*H01S 3/00* (2006.01)
(52) U.S. Cl.
USPC .................................. 359/333; 359/344
(58) Field of Classification Search
USPC .................. 359/333, 344, 346, 349
See application file for complete search history.

(56) References Cited

U.S. PATENT DOCUMENTS

| | | | |
|---|---|---|---|
| 6,992,813 B1 * | 1/2006 | Tanaka et al. | 359/333 |
| 2003/0198404 A1 * | 10/2003 | Frisken et al. | 382/285 |
| 2005/0025419 A1 * | 2/2005 | Fish et al. | 385/31 |
| 2008/0056313 A1 * | 3/2008 | Yamazaki | 372/28 |
| 2009/0059973 A1 * | 3/2009 | Suzuki | 372/20 |
| 2009/0122817 A1 * | 5/2009 | Sato et al. | 372/20 |
| 2010/0034224 A1 * | 2/2010 | Takabayashi et al. | 372/20 |
| 2011/0149381 A1 * | 6/2011 | Hatakeyama | 359/341.1 |
| 2011/0310918 A1 * | 12/2011 | Yoon | 372/26 |

OTHER PUBLICATIONS

Xuezhe, Zheng et al., "A Tunable 1×4 Silicon CMOS Photonic Wavelength Multiplexer/Demultiplexer for Dense Optical Interconnects", Optics Express, 18 (5) 5151-5160, (2010).

* cited by examiner

*Primary Examiner* — Mark Hellner
(74) *Attorney, Agent, or Firm* — Park, Vaughan, Fleming & Dowler, LLP; Steven E. Stupp

(57) ABSTRACT

A laser source includes a semiconductor optical amplifier (SOA) as a gain medium that receives and amplifies an optical signal characterized by at least a wavelength associated with a lasing mode of the laser source. This laser source includes a first optical waveguide and a second optical waveguide optically coupled to the SOA. Furthermore, a wavelength-selective reflector is optically coupled to the first optical waveguide and the second optical waveguide, where a closed loop defined by the SOA, the first optical waveguide, the wavelength-selective reflector and the second optical waveguide defines a cavity of the laser source.

20 Claims, 14 Drawing Sheets

HYBRID LASER SOURCE WITH RING-RESONATOR REFLECTOR

GOVERNMENT LICENSE RIGHTS

This invention was made with Government support under Agreement No. HR0011-08-9-0001 awarded by DARPA. The Government has certain rights in the invention.

CROSS REFERENCE TO RELATED APPLICATION

This application is related to U.S. Non-provisional patent application Ser. No. 13/182,243, entitled "Laser Source with Tunable-Grating-Waveguide Reflectors," by Guoliang Li, Xuezhe Zheng, Ashok V. Krishnamoorthy and Ying L. Luo, filed on 13 Jul. 2011, the contents of which are herein incorporated by reference.

BACKGROUND

1. Field

The present disclosure relates to techniques for communicating optical signals. More specifically, the present disclosure relates to a laser source for an optical signal that includes a ring-resonator reflector and a silicon-optical amplifier (SOA).

2. Related Art

Silicon photonics is a promising technology that can provide large communication bandwidth, low latency and low power consumption for inter-chip and intra-chip connections. In the last few years, significant progress has been made in developing low-cost components for use in inter-chip and intra-chip silicon-photonic connections, including: high-bandwidth efficient silicon modulators, low-loss optical waveguides, wavelength-division-multiplexing (WDM) components, and high-speed CMOS optical-waveguide photo-detectors. However, a suitable low-cost WDM laser source remains a challenge and poses an obstacle to implementing WDM silicon-photonic links.

In particular, existing WDM lasers (such as those used to transmit optical signals in WDM telecommunications systems) are usually very expensive and typically have high power consumption (on the order of a few percent of wall-plug efficiency, which is defined as the coupled-out laser power divided by the total consumed electrical power). Because future WDM silicon-photonic links are expected to include thousands of optical channels (or more), which each consume around 1 mW of optical power, the power consumption of the WDM laser sources is likely to be prohibitive and may obviate the low-power advantage of WDM silicon-photonic links.

Hence, what is needed is a laser source without the above-described problems.

SUMMARY

One embodiment of the present disclosure provides a laser source that outputs an optical signal characterized by at least a wavelength associated with a lasing mode of the laser source. This laser source includes a semiconductor optical amplifier (SOA) as a gain medium that receives and amplifies the optical signal. Moreover, the laser source includes a first optical waveguide and a second optical waveguide optically coupled to the SOA. Furthermore, a wavelength-selective reflector is optically coupled to the first optical waveguide and the second optical waveguide, where a closed loop defined by the SOA, the first optical waveguide, the wavelength-selective reflector and the second optical waveguide defines a cavity of the laser source.

Note that the wavelength-selective reflector includes at least a ring resonator. In some embodiments, the wavelength-selective reflector includes two ring resonators having different sizes.

Moreover, the optical signal may be output by the first optical waveguide and the second optical waveguide after the wavelength-selective reflector. In some embodiments, the optical signal output by the laser source corresponds to a first beam that propagates clockwise around the closed loop and a second beam that propagates counterclockwise around the closed loop.

Furthermore, the laser source may include a bi-directional tap optically coupled to one of the first optical waveguide and the second optical waveguide. The optical signal may be output by the bi-directional tap.

Additionally, the laser source may include a phase-adjustment mechanism. This phase-adjustment mechanism may be included in at least one of the first optical waveguide and the second optical waveguide. In some embodiments, the phase-adjustment mechanism adjusts a phase of the optical signal by thermally tuning an index of refraction of at least one of the first optical waveguide and the second optical waveguide. Alternatively or additionally, the phase-adjustment mechanism may adjust a phase of the optical signal by injecting current into the SOA to change an index of refraction.

In some embodiments, the laser source is implemented on a single semiconductor substrate. Alternatively, the SOA may be implemented on a first semiconductor substrate, and a remainder of the laser source is implemented on a second semiconductor substrate. In these embodiments, the laser source may include an optical coupler optically coupling the SOA on the first semiconductor substrate and the remainder of the laser source on the second semiconductor substrate. For example, the optical coupler may include an optical proximity coupler, such as an etched mirror facet on the first semiconductor substrate and a grating coupler on the second semiconductor substrate. Note that the remainder of the laser source may be implemented using silicon-on-insulator technology on the second semiconductor substrate.

Another embodiment provides a method for outputting an optical signal using the laser source, where the optical signal is characterized by at least the wavelength associated with the lasing mode of the laser source. During this method, the optical signal is received and amplified using the SOA which is configured as the gain medium. Then, the optical signal is optically coupled from the SOA to the first optical waveguide and the second optical waveguide. Moreover, a portion of the optical signal is fed back to the SOA using the wavelength-selective reflector optically coupled to the first optical waveguide and the second optical waveguide. Next, the remainder of the optical signal is output, where the closed loop defined by the SOA, the first optical waveguide, the wavelength-selective reflector and the second optical waveguide defines the cavity of the laser source.

Another embodiment provides another laser source that outputs an optical signal characterized by at least a wavelength associated with a lasing mode of the laser source. This laser source includes a reflective semiconductor optical amplifier (RSOA) as a gain medium to receive and amplify the optical signal. Moreover, the other laser source includes an optical waveguide optically coupled to the RSOA, where the optical waveguide is split into two arms. Furthermore, the other laser source includes a wavelength-selective reflector optically coupled to the arms of the optical waveguide, where a closed loop defined by the RSOA, the optical waveguide, and the wavelength-selective reflector defines a cavity of the laser source.

Note that the wavelength-selective reflector includes at least a ring resonator. In some embodiments, the wavelength-selective reflector includes two ring resonators having different sizes.

Moreover, the optical signal may be output by the arms of the optical waveguide after the wavelength-selective reflector.

In some embodiments, the other laser source includes a bi-directional tap optically coupled to the optical waveguide, where the optical signal is output by the bi-directional tap.

Another embodiment provides a method for outputting an optical signal using the other laser source, where the optical signal is characterized by at least the wavelength associated with the lasing mode of the other laser source. During this method, the optical signal is received and amplified using the RSOA which is configured as the gain medium. Then, the optical signal is optically coupled from the RSOA to the optical waveguide, which is split into two arms. Moreover, a portion of the optical signal is fed back to the RSOA using the wavelength-selective reflector optically coupled to the two arms of the optical waveguide. Next, the remainder of the optical signal is output, where the closed loop defined by the RSOA, the optical waveguide and the wavelength-selective reflector defines the cavity of the laser source.

Another embodiment provides a system that includes the laser source and/or the other laser source.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of a laser source, a system that includes the laser source, and a technique for outputting an optical signal using the laser source are described. The laser source includes a semiconductor optical amplifier (SOA) as a gain medium that receives and amplifies an optical signal characterized by at least a wavelength associated with a lasing mode of the laser source. Moreover, the laser source includes a first optical waveguide and a second optical waveguide optically coupled to the SOA. Furthermore, a wavelength-selective reflector is optically coupled to the first optical waveguide and the second optical waveguide, where a closed loop defined by the SOA, the first optical waveguide, the wavelength-selective reflector and the second optical waveguide defines a cavity of the laser source.

This optical technique may allow a low-cost, low-power laser source to be implemented for use in a variety of applications, such as a WDM silicon-photonic link. Consequently, the laser source may help facilitate high-speed inter- and intra-chip silicon-photonic interconnects, as well as associated systems that can include this component (such as high-performance computing systems).

We now describe embodiments of the laser source. There are three principle contributions to the power consumption of a laser source, including: the power to generate the light, the power for wavelength control, and the power for laser cooling. Typically, the cooling power dominates. This is because of the low efficiency of a thermal-electrical-cooler (TEC), which typically consumes a few watts of electrical power to maintain the laser-package temperature. Moreover, because the typical laser source tightly integrates the gain medium and the resonator cavity, it is usually not possible to remove the TEC to improve the overall laser efficiency. In particular, without temperature control, the effective lasing cavity length changes with the temperature, which can make the lasing wavelength unstable.

In the laser source described below, this problem is addressed by separating the gain medium from the remainder of the lasing cavity. In particular, a low-power tunable laser source is described. This laser source includes a wavelength-selective reflector (such as one or more ring resonator(s)) and an un-cooled SOA. By separating the gain medium from the wavelength-selective reflector, the laser source provides low-power wavelength control and better overall wall-plug efficiency.

Figure 1A:
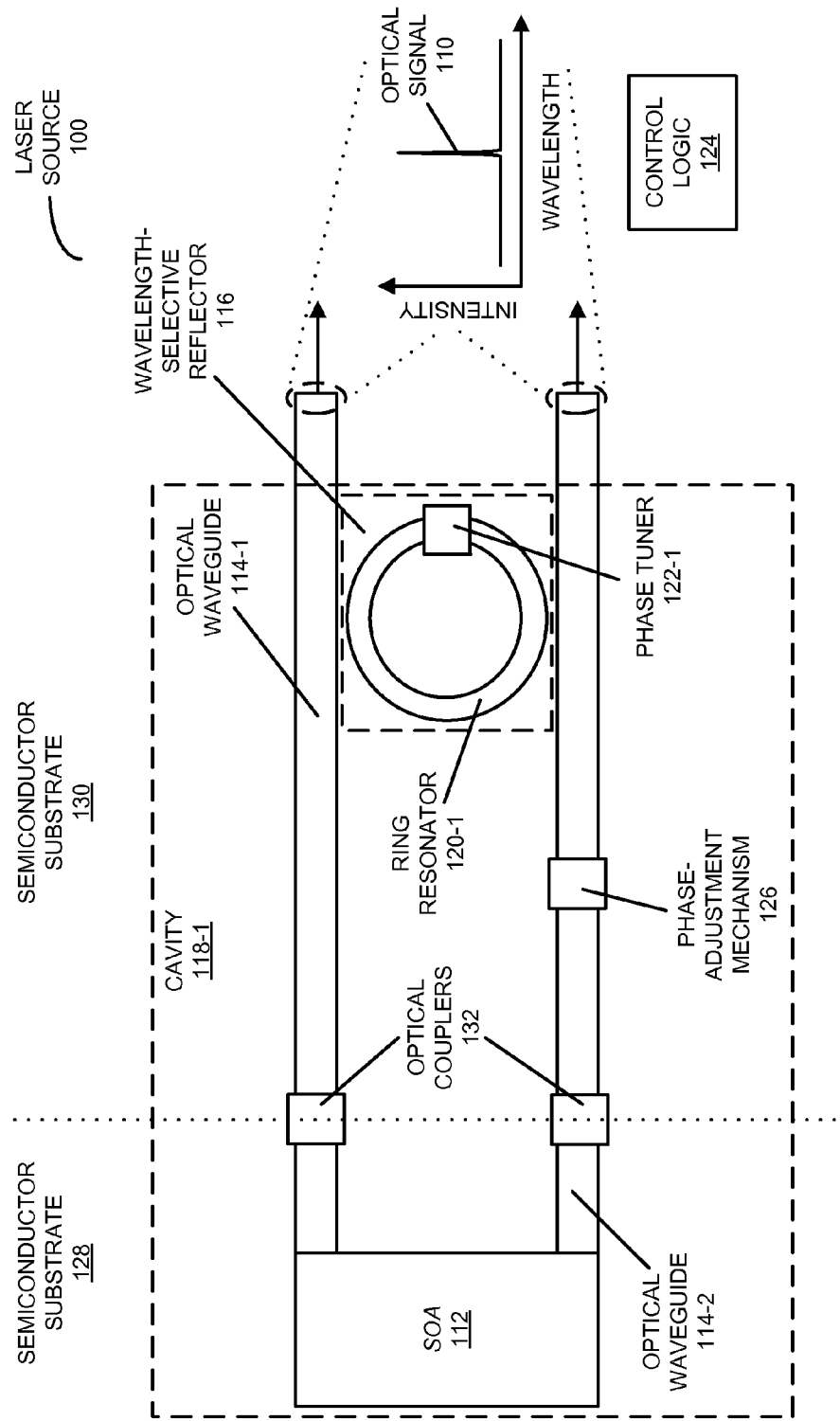
FIG. 1A is a block diagram of a laser source that outputs an optical signal characterized by at least a wavelength associated with a lasing mode of the laser source in accordance with an embodiment of the present disclosure.

FIG. 1A presents a block diagram of a laser source 100 that outputs an optical signal 110 characterized by at least a wavelength associated with a lasing mode of the laser source (such as a carrier wavelength for use in an optical channel in an optical link). This laser source includes a semiconductor optical amplifier (SOA) 112 as a gain medium that receives and amplifies optical signal 110. For example, SOA 112 may include indium-phosphide (and, more generally, a hybrid bonded III-IV semiconductor) or germanium.

Moreover, laser source 100 includes optical waveguides 114 (which are sometimes referred to as 'bus waveguides') optically coupled to SOA 112. Furthermore, a wavelength-selective reflector 116 is optically coupled to optical waveguides 114, where a closed loop defined by SOA 112, optical waveguide 114-1, wavelength-selective reflector 116 and optical waveguide 114-2 defines a cavity 118-1 of laser source 100.

Figure 2A:
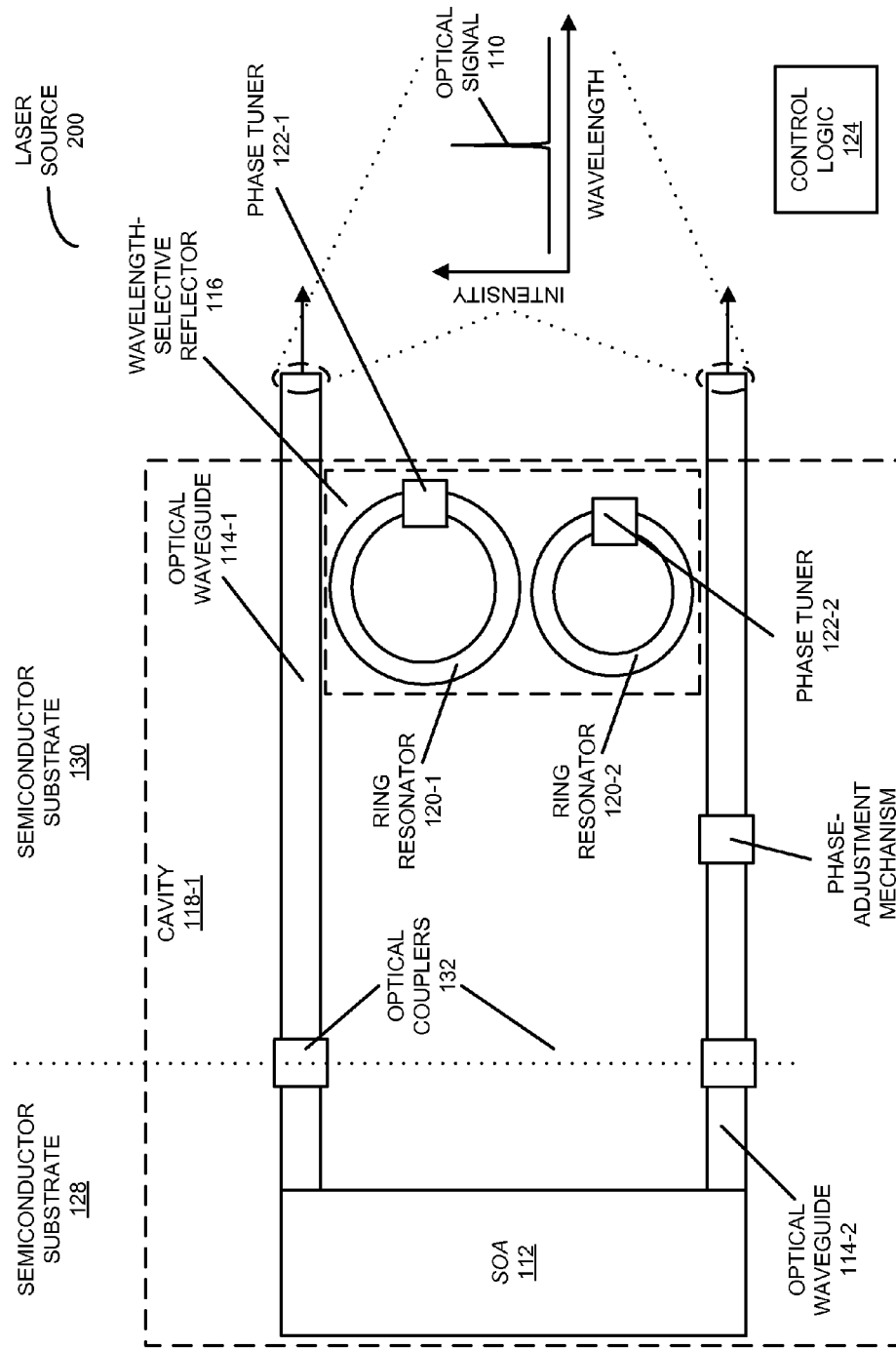
FIG. 2A is a block diagram of a laser source that outputs an optical signal characterized by at least a wavelength associated with a lasing mode of the laser source in accordance with an embodiment of the present disclosure.

Note that wavelength-selective reflector 116 includes at least a ring resonator (or ring-resonator reflector) 120-1. However, in other embodiments, wavelength-selective reflector 116 includes two ring resonators 120 having different sizes (e.g., different radii). This is shown in FIG. 2A, which presents a block diagram of a laser source 200.

Note that a given ring resonator may be characterized by its: quality (Q) factor, bandwidth, coupling wavelength to optical waveguides 114, and/or free-spectral range (or, equivalently, its size, such as the radius of the given ring resonator). (Note that a small ring resonator has a large free-spectral range, and a large ring resonator has a small free-spectral range.) Furthermore, ring resonator(s) 120 may be coupled to optical waveguides 114 so that at the resonance or coupling wavelength of the given ring resonator (as well as possibly at its integer multiples or harmonics) at least a small portion of its resonance wavelength is fed back to SOA 112. (To achieve lasing, the ratio is controlled such that the total cavity loss is less than the gain of SOA 112.) Note that the Q factor and the bandwidth may determine the width of the filtering by the given ring resonator, and thus the sharpness of at least the wavelength. In addition, the Q factor of the given ring resonator may be specified by or may be a function of the optical coupling between optical waveguides 114 and the given ring resonator, as well as a round-trip optical loss in the given ring resonator. In an exemplary embodiment, the ring resonator(s) has a radius between 7 and 100 μm.

Because of the periodic nature of the ring-resonator filters, multiple resonant wavelengths may get fed back if the free-spectral range of ring resonator(s) 120 is not larger than the gain bandwidth of SOA 112, which can result in multiple lasing modes. With a traditional quantum-well gain medium, these modes may compete with each other, causing instabilities. One way to improve this is to use a quantum dot-based gain medium to stably support multiple laser modes. Alternatively or additionally, ring resonator(s) 120 may be made small enough such that their free-spectral range is larger than the bandwidth of the cavity gain. As shown in FIG. 2A, another alternate is to use Vernier rings (e.g., ring resonators 120 with different radii) to achieve a filter with large enough free-spectral range. In this case, only resonances corresponding to the least common multiple of the free-spectral ranges of ring resonators 120 are enhanced, while the others are efficiently suppressed.

In some embodiments, ring resonator(s) 120 are tuned because manufacturing tolerances result in large variations in the coupling wavelengths across a wafer (or integrated circuit) and/or between wafers. In particular, ring resonator(s) may include one or more phase tuners 122 that match a coupling wavelength of ring resonator(s) 120 with the wavelength of optical signal 110, thereby optically coupling optical signal 110 between optical waveguides 114. Note that the phase values of the one or more phase tuners 122 may be thermally tunable because electrical tuning may spoil the Q factor of ring resonator(s) 120 by adding additional loss into the ring-resonator waveguide(s). (Nonetheless, in some embodiments electronic tuning is used, for example, a p-i-n tuner.) However, thermal tuning may result in increased power consumption.

By changing the narrow band feed-back shift relative to the cavity modes and the gain of SOA 112, at least the wavelength in optical signal 110 output by laser source 100 can be tuned, i.e., the lasing mode may be selectable (for example, using control logic 124). Note that cavity 118-1 may be long enough, e.g., greater than 10 cm, such that the cavity modes are so close to each other that there is always a cavity mode close enough to the peak wavelength of wavelength-selective reflector 116, and pseudo continuous tuning can be achieved. Another advantage of a long cavity is that the effective cavity phase change associated with the gain-medium index variation becomes relatively small. Therefore, the gain medium can be un-cooled with little impact on the lasing mode stability, and with a commensurate reduction in power consumption.

Referring back to FIG. 1A, optical signal 110 may be output by optical waveguides 114 after wavelength-selective reflector 116. In some embodiments, because SOA 112 supports bi-directional amplification, optical signal 110 output by laser source 100 corresponds to a first beam that propagates clockwise around the closed loop and a second beam that propagates counterclockwise around the closed loop. Thus, optical signal 110 may be output equally by the two output ports of wavelength-selective reflector 116.

Additionally, laser source 100 may include a phase-adjustment mechanism 126. This phase-adjustment mechanism may be included in at least one of optical waveguides 114. In some embodiments, phase-adjustment mechanism 126 adjusts a phase of optical signal 110 by thermally tuning an index of refraction of at least one of optical waveguides 114 using a heater. Alternatively or additionally, phase-adjustment mechanism 126 may adjust a phase of optical signal 110 by injecting current into SOA 112 to change an index of refraction, for example, by using a p-i-n tuner.

In some embodiments, laser source 100 is implemented on a single semiconductor substrate. Alternatively, as shown in FIGS. 1A-2B, SOA 112 may be implemented on a semiconductor substrate 128, and a remainder of laser source 100 is implemented on a semiconductor substrate 130. In these embodiments, laser source 100 may include optical couplers 132 optically coupling SOA 112 on semiconductor substrate 128 and the remainder of laser source 100 on semiconductor substrate 130. For example, optical couplers 132 may include an optical proximity coupler, such as an etched mirror facet on semiconductor substrate 128 and a grating coupler on semiconductor substrate 130. Note that the remainder of laser source 100 (or the entire laser source 100 in embodiments on the single semiconductor substrate) may be implemented using silicon-on-insulator technology on semiconductor substrate 130 (as described further below with reference to FIG. 6).

Figure 1B:
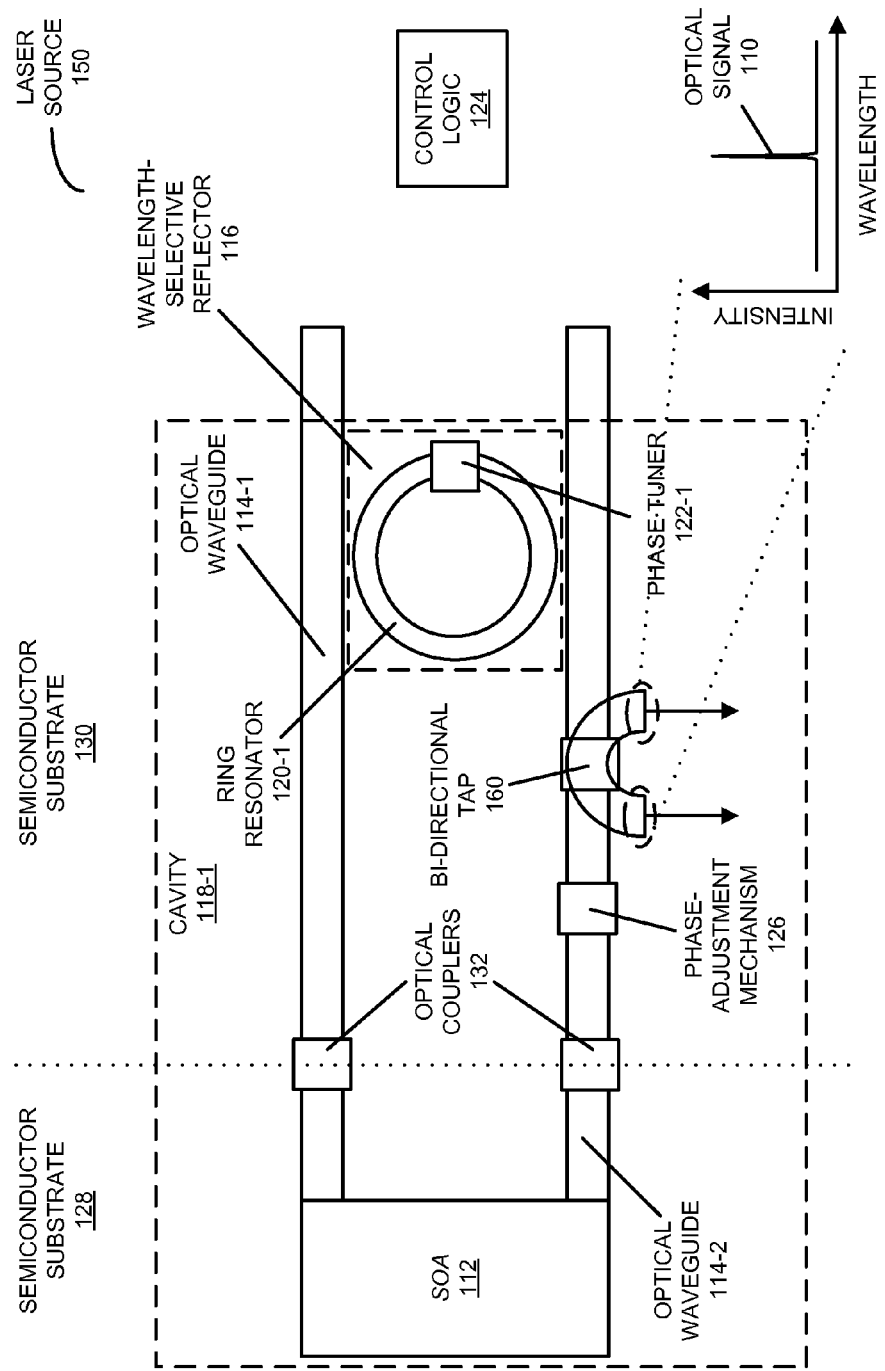
FIG. 1B is a block diagram of a laser source that outputs an optical signal characterized by at least a wavelength associated with a lasing mode of the laser source in accordance with an embodiment of the present disclosure.
Figure 2B:
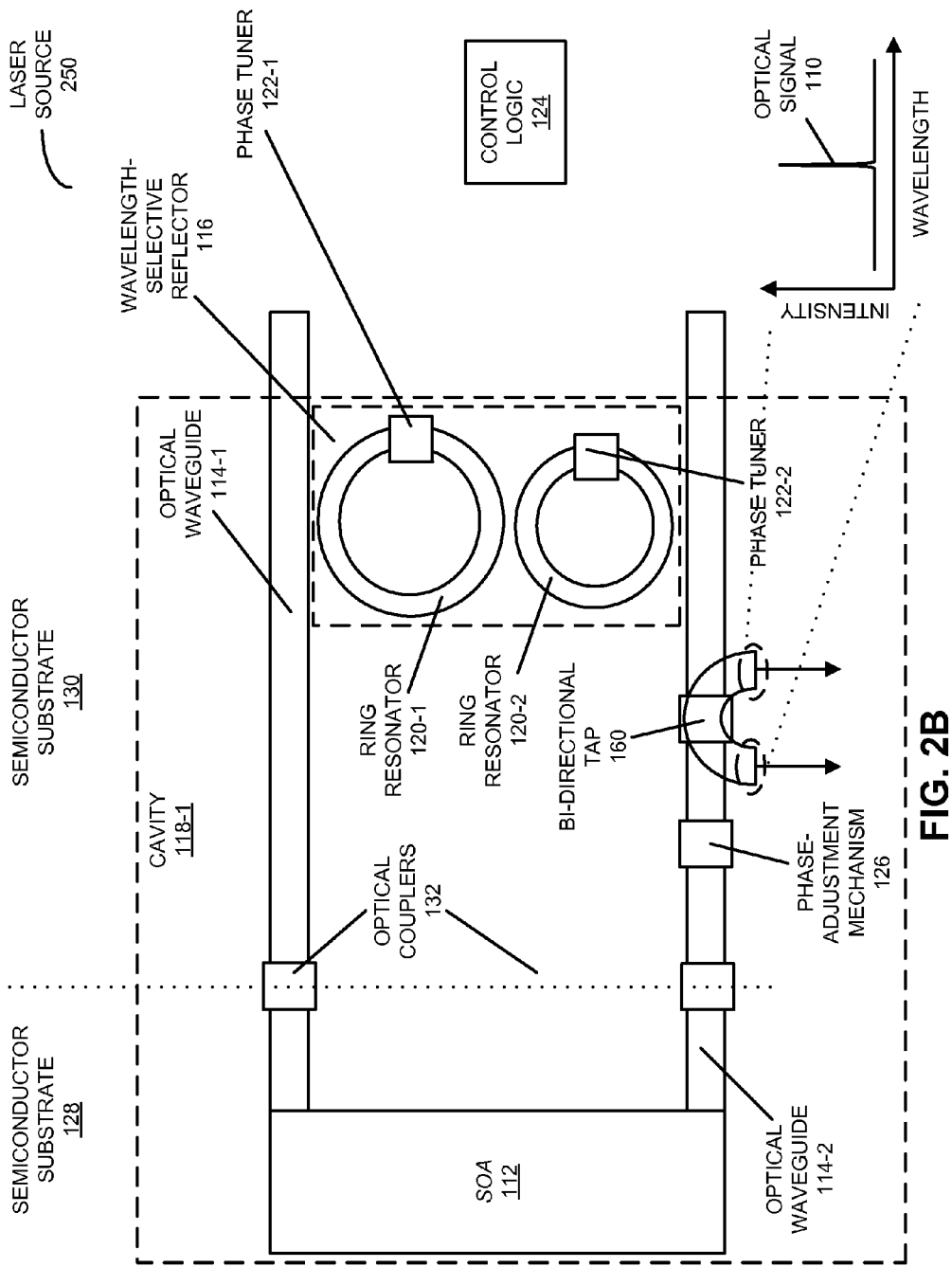
FIG. 2B is a block diagram of a laser source that outputs an optical signal characterized by at least a wavelength associated with a lasing mode of the laser source in accordance with an embodiment of the present disclosure.

Furthermore, in some embodiments the laser source may include a bi-directional tap optically coupled to one of optical waveguides 114. This is shown in FIGS. 1B and 2B, which, respectively, present block diagrams of laser sources 150 and 250. In these laser sources, optical signal 110 may be output by bi-directional tap 160, with its ratio controlled such that the total cavity loss is less than the gain of SOA 112. Because SOA 112 supports bi-directional amplification, equal lasing output can be obtained at the two output ports of bi-directional tap 160.

Note that in these embodiments the ring resonator(s) 120 in wavelength-selective reflector 116 may be critically or optimally coupled to optical waveguides 114 so that at the resonance or coupling wavelength of the given ring resonator (as well as possibly at its integer multiples or harmonics) there is maximal transfer of energy from one component to the next in the closed loop without or with reduced reflections, such as the energy transfer from optical waveguide 114-1 to ring resonator 120-1, etc. Moreover, note that the small output at the ring-resonator filter output ports can serve as monitor ports.

Figure 3A:
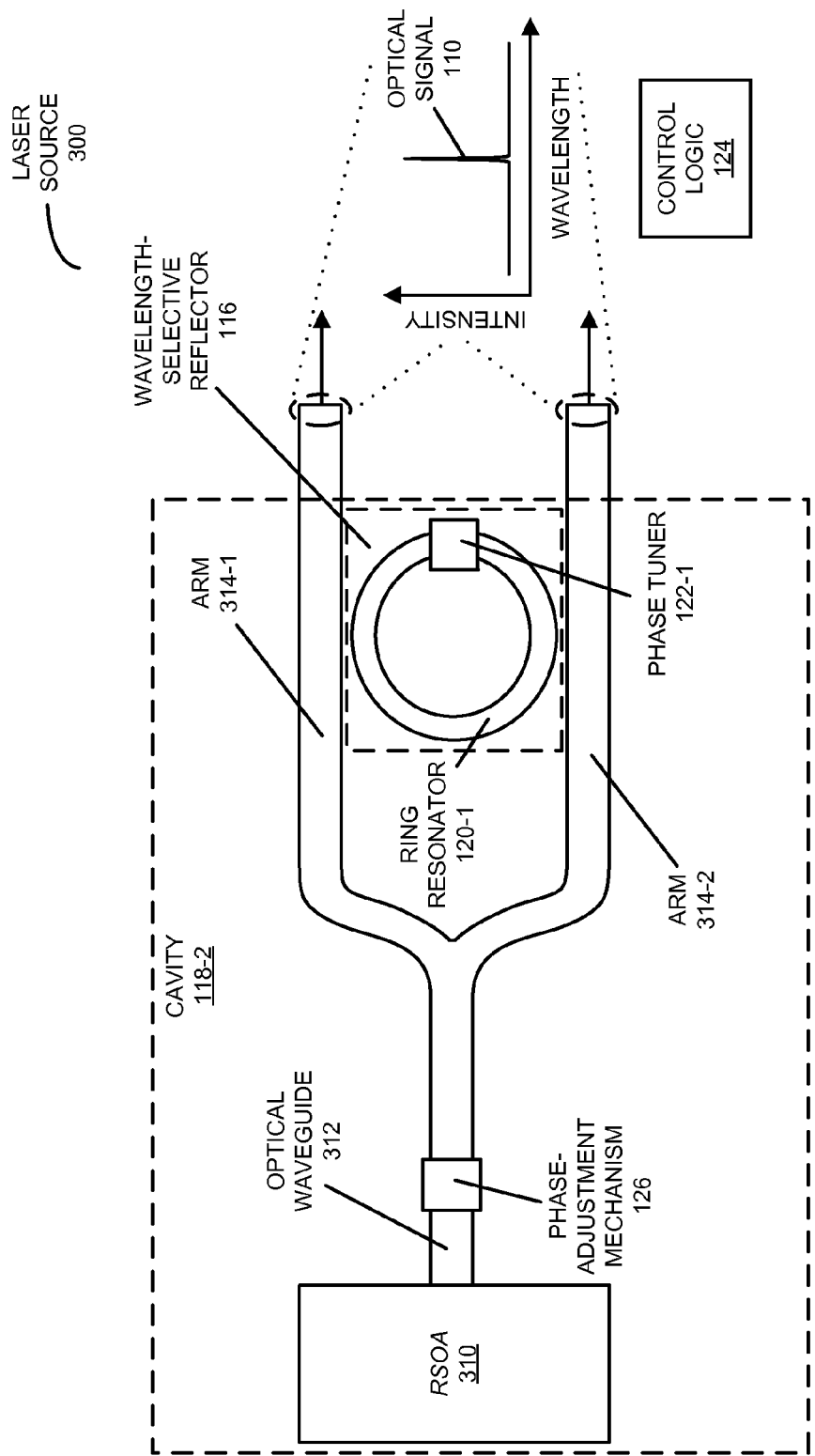
FIG. 3A is a block diagram of a laser source in accordance with an embodiment of the present disclosure.

A variation on the laser source uses a reflective semiconductor optical amplifier (RSOA). This is shown in FIG. 3A, which presents a block diagram of a laser source 300. In this laser source, RSOA 310 is a gain medium that receives and amplifies optical signal 110. Moreover, laser source 300 includes an optical waveguide 312 optically coupled to RSOA 310, where optical waveguide 312 is split into two arms 314. Furthermore, laser source 300 includes a wavelength-selective reflector 116 optically coupled to arms 314 of optical waveguide 312, where a closed loop defined by RSOA 310, optical waveguide 312, and wavelength-selective reflector 116 defines a cavity 118-2 of laser source 300.

Note that wavelength-selective reflector 116 includes at least a ring resonator 120-1. Part of the two outputs of RSOA 310 at the ring-resonance wavelength go through ring resonator 120-1, are recombined at the splitter, and are fed back to RSOA 310. However, in other embodiments, wavelength-selective reflector 116 includes two ring resonators having different sizes (e.g., different radii). This Vernier ring may increase the free-spectral range.

Figure 3B:
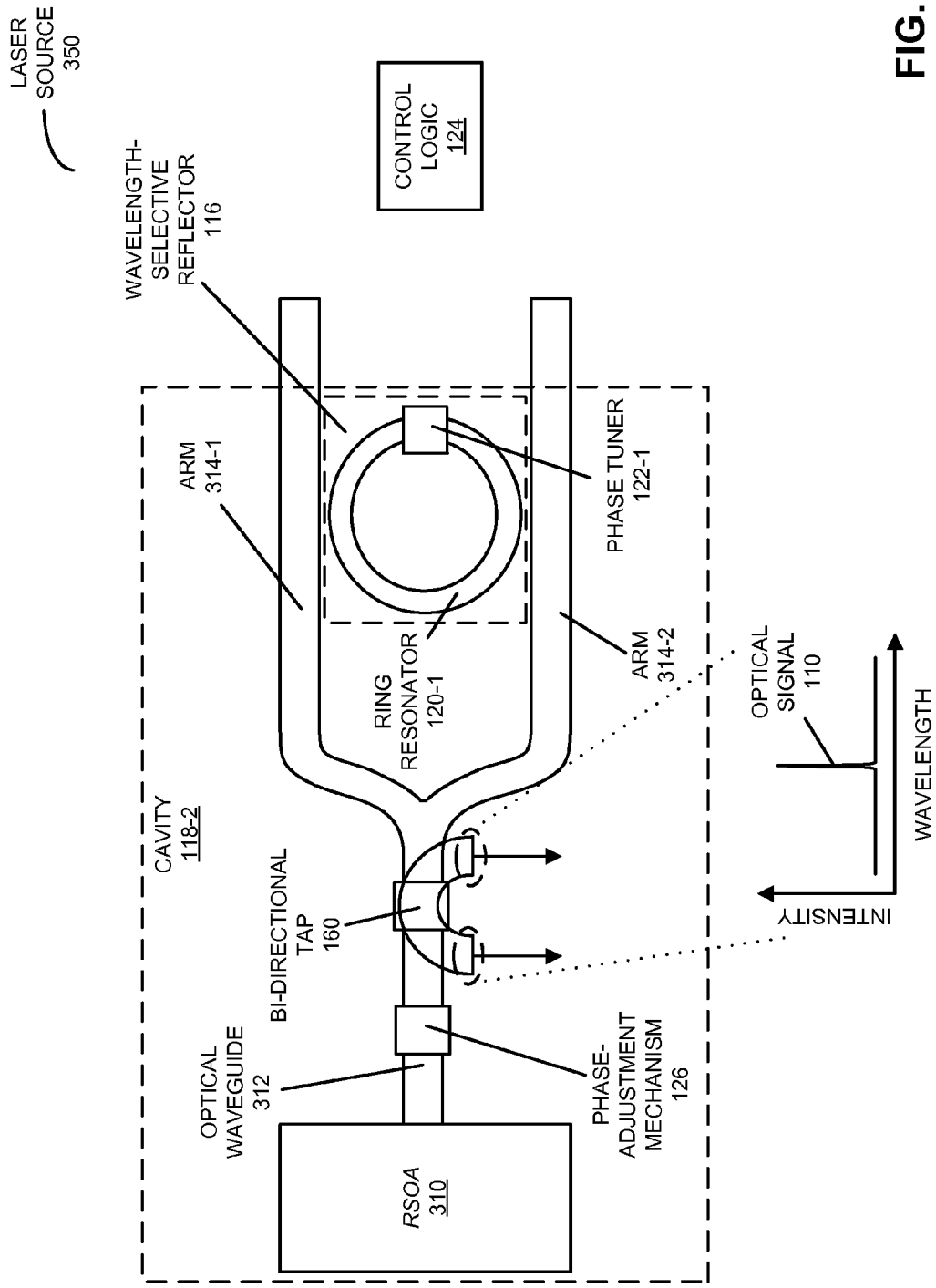
FIG. 3B is a block diagram of a laser source in accordance with an embodiment of the present disclosure.

Moreover, optical signal 110 may be output by arms 314 of optical waveguide 312 after wavelength-selective reflector 116. However, in some embodiments laser source 300 includes bi-directional tap 160 optically coupled to optical waveguide 312, where optical signal 110 is output by bi-directional tap 160. This is shown in FIG. 3B, which presents a block diagram of a laser source 350.

We now discuss another wavelength-tunable laser structure. Optical interconnects are being considered as a solution to the inter-chip communication bottleneck for high performance computing systems that include many processor chips and memory chips. Compared with the electrical interconnects, optical interconnects offer: higher bandwidths, especially when WDM is used; faster signal propagation; point-to-point communication that can effectively reduce the message latency between chips; and small propagation loss, which is also frequency independent, and which can extend the communication distance with little extra power consumption. Among various proposed optical solutions, silicon photonic links are attractive because of their compatibility with the CMOS fabrication process (which enables low cost, high yield and monolithic integration with VLSI circuits) and extremely compact optical waveguides (which lead to a small footprint and low power consumption).

To date, most of the silicon photonic components, except the laser source, are available for use in an optical link that consumes less than 1 pJ/bit. However, in order to make a sub-pJ/bit optical link, a high-efficiency laser is needed. For this application, the target wall-plug efficiency is 20%. In addition, the spectral linewidth of the optical signal needs to be less than 10 pm to be compatible with silicon photonic-resonator devices (such as ring-resonator modulators). State-of-the-art laser sources typically have an efficiency of 1-2%. For these laser sources, more than 80% of the electrical power is consumed by the TEC in order to maintain high-power lasing (such as greater than 40 mW) with a stable wavelength and good slope efficiency. Alternatively, while uncooled laser sources with efficiency close to 10% and output power of 2-4 mW are available, these laser sources usually do not have stable wavelengths because of the lack of control. In addition, the lasing linewidths are usually greater than 100 pm.

Figure 6:
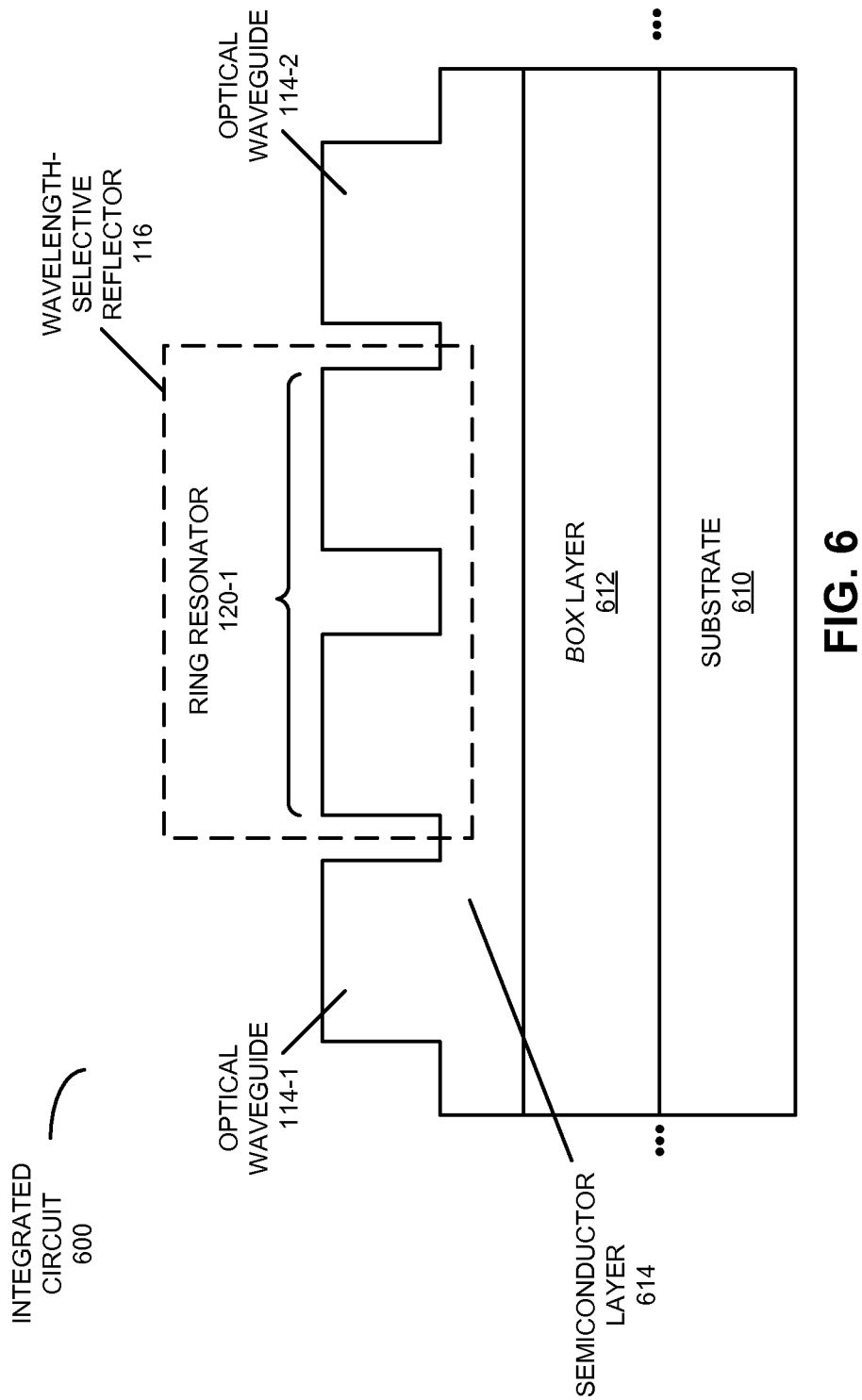
FIG. 6 is a block diagram illustrating an integrated circuit in accordance with an embodiment of the present disclosure.

In the embodiments of the laser source described below, a laser structure is fabricated using SOI technology (as described further below with reference to FIG. 6). By leveraging silicon photonics, it offers: fine control of waveguide grating, low optical loss in the optical waveguide, efficient wavelength tuning using a forward-biased p-i-n diode, and low-loss inter-layer optical couplers (or optical proximity couplers). Consequently, a power-hungry TEC and thermal optical tuning are avoided. Using this laser source, high laser efficiency and narrow laser linewidth can be achieved.

Figure 4A:
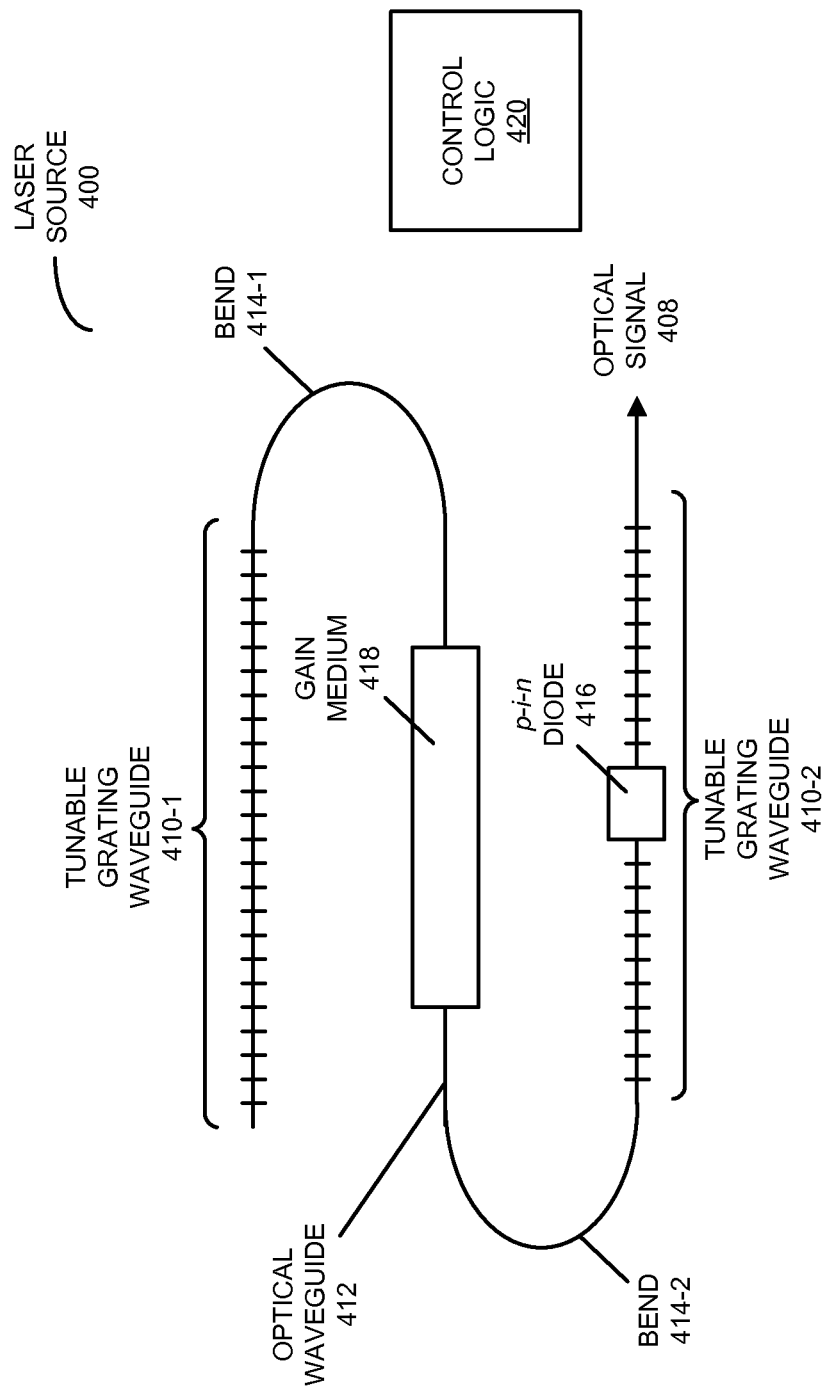
FIG. 4A is a block diagram of a laser source in accordance with an embodiment of the present disclosure.
Figure 4B:
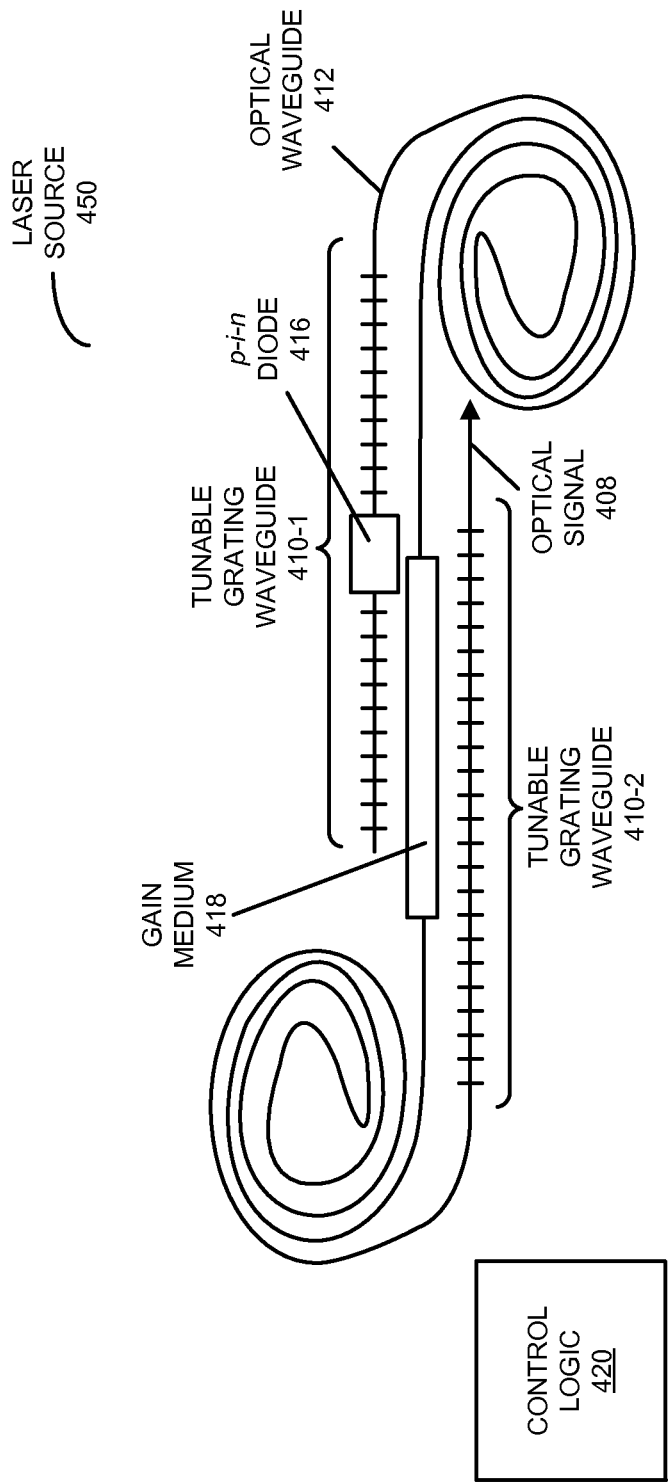
FIG. 4B is a block diagram of a laser source in accordance with an embodiment of the present disclosure.

FIG. 4A presents a block diagram of a laser source 400 with tunable-grating waveguides 410 (which are sometimes referred to as tunable-grating-waveguide reflectors), which outputs an optical signal 408. This laser source has an optical waveguide 412 with a serpentine routing that defines an optical cavity (the actual structure can have more bends in order to tightly lay out a long cavity). Similarly, FIG. 4B presents a block diagram of a laser source 450 with tunable-grating waveguides 410 and an optical waveguide 460 with a spiral routing. (More generally, the optical waveguide in these embodiments may have a curved routing.) These laser sources have a long cavity length, such as 6 mm (which is the length obtained by unfurling the serpentine or spiral routing between tunable-grating waveguides 410), which results in very dense Fabry-Pérot cavity modes with small wavelength spacing (approximately 100 pm for a 6-mm long cavity). This may eliminate the need for phase tuning of the optical cavity because the cavity modes are almost continuous. Moreover, a wavelength target can be met within 100 pm error, which is acceptable in optical interconnect links. Furthermore, the long cavity also provides a very fine resonance (with a spectral linewidth less than 10 pm) for each mode, which can meet the laser linewidth target for the optical interconnect links. Because of the low propagation loss of a silicon optical waveguide, this long optical cavity can have an optical loss around 1 dB.

In order to make the long cavity compact, it can be folded using very tight waveguide bends 414 (approximately 10 μm radius) with low loss because of the tight optical confinement in a silicon optical waveguide. Using the examples in FIGS. 4A and 4B, it is possible to lay out the long cavity within an area of $300 \times 500 \ \mu m^2$.

In addition, tunable-grating waveguides 410 may include reflective waveguide gratings (at each end of the optical cavity) to enable resonance. These gratings may also determine which cavity mode can lase. The gratings may include periodic corrugations, either on the optical waveguide top surface or at the optical waveguide sidewalls. By using gratings as cavity-end reflectors, a large free spectral range (hundreds of nanometers) can be achieved in the reflection spectrum, which ensures that only one wavelength band has good overlap with the gain spectrum. Although the reflection band of the gratings can be quite wide (greater than 1 nm), which may contain tens of cavity modes, normally only one mode with the largest reflection and gain coefficients can lase; all other cavity modes are suppressed because the gain is less than the loss. Furthermore, the reflection bands of the two gratings can be offset from each other, so that their overlapping band is much narrower, thereby further ensuring single-mode lasing. Note that the reflection band (center wavelength, peak reflection, bandwidth and shape) of the gratings can be designed by controlling the corrugation period, amplitude, shape, and the grating length.

In order to tune the lasing wavelength in these laser sources, the reflection bands of the two gratings may be shifted together. For example, carrier-injection tuning may be implemented by a forward-biased p-i-n diode 416 in at least one of the grating waveguides based on a control signal from control logic 420. Carrier-injection tuning can provide high efficiency with very low power consumption (approximately 3 nm/mW), which in turn generates negligible heat, thereby avoiding degradation of the gain in the cavity. Although carrier injection can make the grating waveguide optically lossy because of free-carrier absorption, it may not affect the cavity significantly because the optical signal only penetrates a few micrometers into the grating at the center wavelength of the reflection band.

Figure 5:
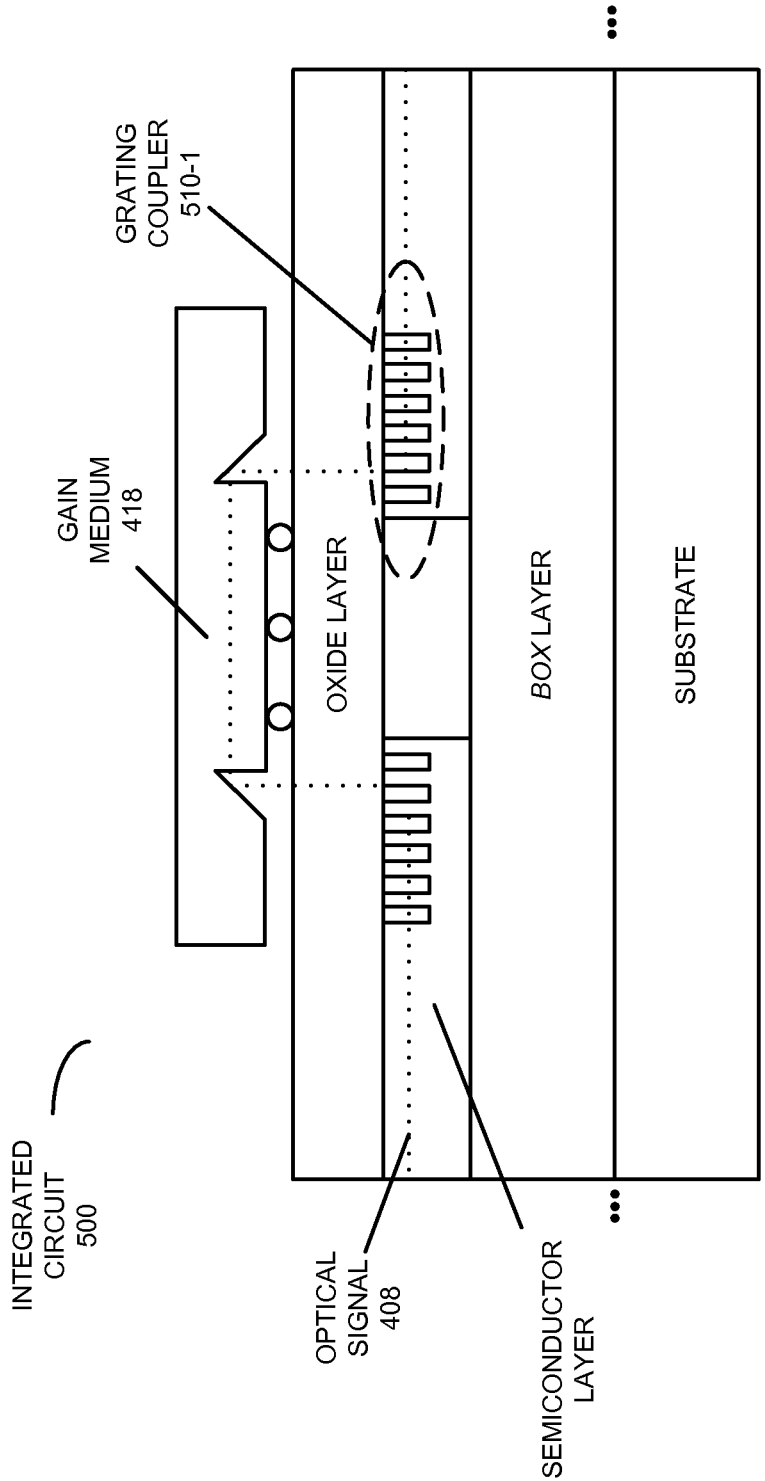
FIG. 5 is a block diagram of a gain medium in an integrated circuit that includes the laser source of FIG. 4A or 4B in accordance with an embodiment of the present disclosure.

Note that in laser sources 400 (FIG. 4A) and 450 (FIG. 4B) a section of gain medium 418 may be hybrid-integrated with a small portion of the long cavity of the silicon optical waveguide. This is shown in FIG. 5, which presents a block diagram of gain medium 418 in an integrated circuit 500 that includes laser source 400 (FIG. 4A) or 450 (FIG. 4B). This gain medium may be a III-V material or Ge material (such as quantum dots). In integrated circuit 500, gain medium 418 is flip-chip bonded on top of the dielectric stack of the CMOS photonic chip, and optical signal 408 is coupled in and out of gain medium 418 using grating couplers (such as grating coupler 510-1), which may include vertical grating couplers and/or 45° reflective mirrors. The metal contacts for electrically pumping gain medium 418 may be solder-bonded to the circuits on the CMOS chip. This integration technique may not involve too much post-processing of the CMOS chip, and the optical mode may have large overlap with gain medium 418. However, the two optical vertical hops may increase the optical loss of the optical cavity. With optimized design and fabrication, this added loss can be reduced to 2-3 dB.

In summary, the laser structure in laser sources 400 (FIG. 4A) and 450 (FIG. 4B) include a long optical cavity so that the cavity phase does not need to be tuned to meet the wavelength target, and a small lasing linewidth can be achieved. Furthermore, a single lasing cavity mode can be selected using waveguide gratings as the cavity reflectors and a current-injection p-i-n diode in the waveguide grating to tune the reflector wavelength. The high-efficiency reflector tuning, in conjunction with no tuning for the cavity phase, can greatly enhance the laser wall-plug efficiency. Consequently, a power-hungry TEC can be avoided with proper heat sinking design of the laser source. Furthermore, low-loss vertical optical couplers can guide the optical mode in and out of the gain medium, so that the gain medium can overlap with a large portion of the optical mode during amplification. This can reduce lasing threshold current and can enhance lasing efficiency.

In some embodiments, at least a portion of one of the preceding embodiments of the laser source is disposed on an integrated circuit. This is shown in FIG. 6, which presents a block diagram illustrating an integrated circuit 600. In this integrated circuit, one or more optical waveguides 114 and wavelength-selective reflector 116 may be defined in a semiconductor layer 614. Furthermore, integrated circuit 600 may include a substrate 610 and a buried-oxide (BOX) layer 612 deposited on substrate 610, where semiconductor layer 614 is disposed on BOX layer 612.

Note that substrate 610 may include silicon, BOX layer 612 may include a dielectric or an oxide (such as silicon dioxide), and/or semiconductor layer 614 may include silicon (thus, optical waveguide(s) 114 may include silicon optical waveguides). Therefore, substrate 610, BOX layer 612 and semiconductor layer 614 may constitute a silicon-on-insulator (SOI) technology. In some embodiments, the silicon in semiconductor layer 614 is 0.5 μm thick, and the silicon-dioxide layer may have a thickness between 0.1 and 10 μm.

Note that in the embodiments, such as FIG. 6, the light is confined in semiconductor layer 614 and may be surrounded on all sides (including below) by an oxide. However, in other embodiments a waveguide ring or a waveguide modulator may be fabricated using a different confinement, such as a polymer ring deposited on an oxide, or poly-silicon surrounded by an oxide (in which case BOX layer 612 may not be needed).

Figure 7:
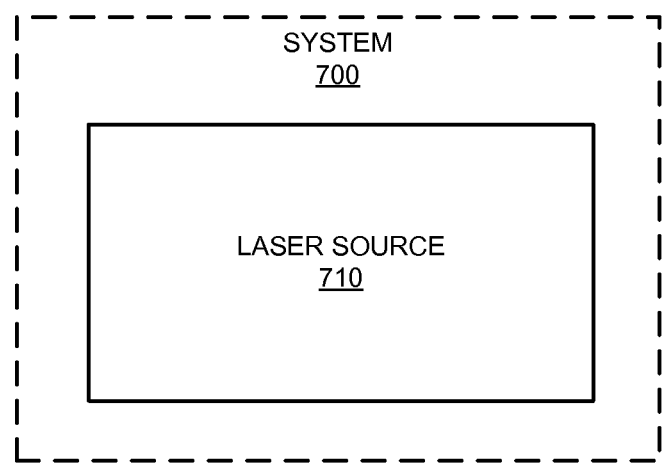
FIG. 7 is a block diagram illustrating a system that includes one of the laser sources of FIGS. 1A-4B in accordance with an embodiment of the present disclosure.

One or more of the preceding embodiments of the laser source may be included in a system and/or an electronic device. This is illustrated in FIG. 7, which presents a block diagram illustrating a system 700 that includes a laser source 710, such as at least one of the laser sources of FIGS. 1A-4B.

The laser source may be used in a variety of applications, including: VLSI circuits, communication systems (such as WDM), storage area networks, data centers, networks (such as local area networks), and/or computer systems (such as multiple-core processor computer systems). Note that system 700 may include, but is not limited to: a server, a laptop computer, a communication device or system, a personal computer, a work station, a mainframe computer, a blade, an enterprise computer, a data center, a portable-computing device, a supercomputer, a network-attached-storage (NAS) system, a storage-area-network (SAN) system, and/or another electronic computing device. Moreover, note that a given computer system may be at one location or may be distributed over multiple, geographically dispersed locations.

For example, the output signal from the laser source, with appropriate tuning of the wavelength, may be used in corresponding optical channels in an optical link. In this embodiment, at least the wavelength output by the laser source may be modulated by one or more modulators to encode data for a given optical channel onto at least the wavelength. This modulation may be independent of that performed by other modulators on other wavelengths output in optical signals from other laser sources. After a given wavelength has been modulated, the modulated optical signals may be combined by a combiner and output onto a common optical link. (In general, the optical signals can be modulated before or after combining.)

Note that either narrow-band or broad-band modulators may be used. In embodiments where narrow-band modulation is used, such as using ring-resonator modulators, which are usually associated with a very small ring-resonance shift (on the order of a few tens of picometers), the wavelengths for each of the optical channels may need to have a very narrow linewidth (such as less than a few picometers). Therefore, these embodiments may use highly accurate tuning of these components. Alternatively, if broadband modulators are used to encode data on the outputs from multiple laser sources (such as a Mach-Zehnder-interferometer modulator, an electro-absorption modulator, and/or a modulator that has a bandwidth greater than 10 nm), the laser-source linewidths may be relaxed to sub-nanometers if the transmission is high-speed (e.g., greater than 10 Gbps) and is over short distances.

The preceding embodiments of the laser source, integrated circuit 600 (FIG. 6) and/or system 700 may include fewer components or additional components. For example, semiconductor layer 614 in FIG. 6 may include poly-silicon or amorphous silicon. Furthermore, a wide variety of fabrication techniques may be used to fabricate the laser source in the preceding embodiments, as is known to one of skill in the art. In addition, a wide variety of optical components may be used in or in conjunction with the laser source (such as alternative optical filters that replace the ring resonator(s)).

While the gain medium is included in SOA 112 (FIGS. 1A-2B) and RSOA 310 (FIGS. 3A-3B), in other embodiments a wide variety of gain elements and lasers may be used, including: a semiconductor laser, a Fabry-Perot laser, a laser that receives and outputs light from the same facet, etc.

Although these embodiments are illustrated as having a number of discrete items, the embodiments of the laser source, the integrated circuit and the system are intended to be functional descriptions of the various features that may be present rather than structural schematics of the embodiments described herein. Consequently, in these embodiments two or more components may be combined into a single component, and/or a position of one or more components may be changed.

Figure 8:
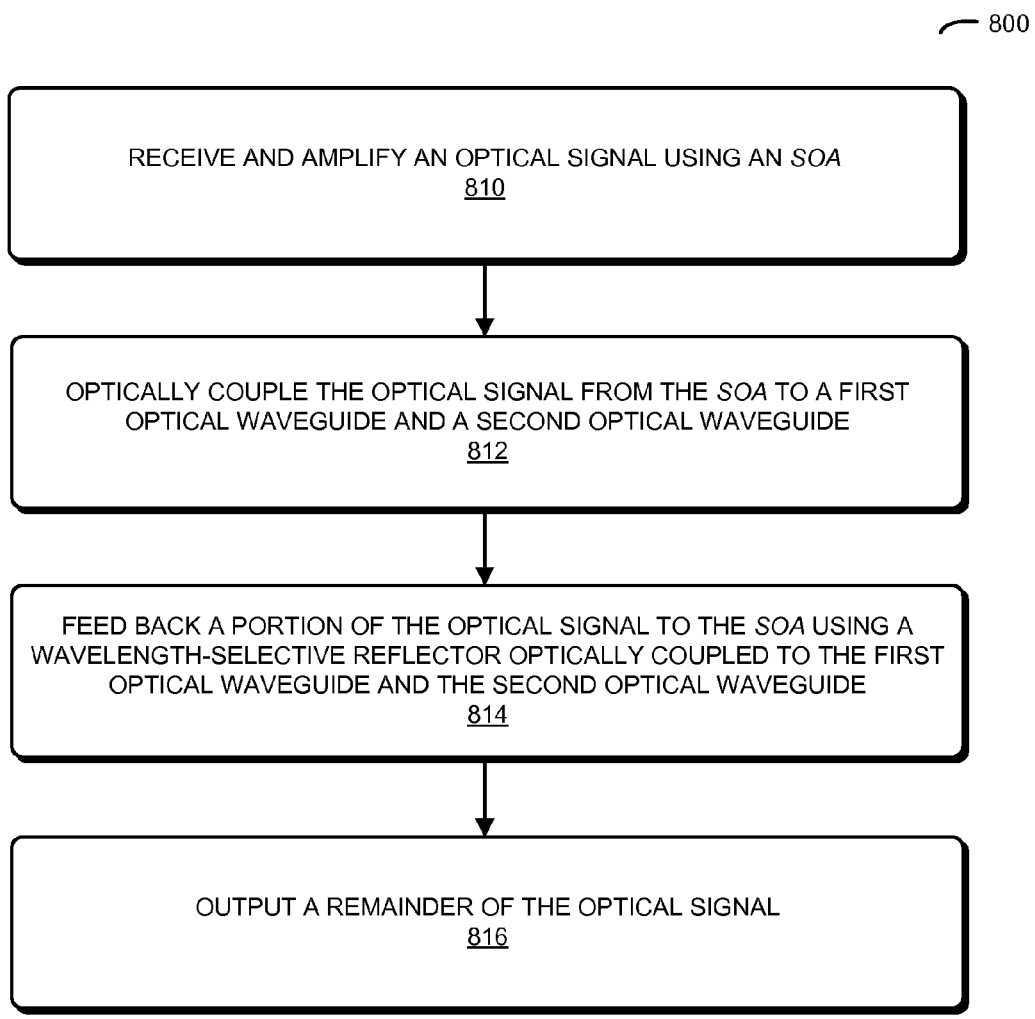
FIG. 8 is a flow chart illustrating a method for outputting an optical signal using the laser source of FIG. 1A, 1B, 2A or 2B in accordance with an embodiment of the present disclosure.

We now describe embodiments of the method. FIG. 8 presents a flow chart illustrating a method 800 for outputting the optical signal using laser source 100 (FIG. 1A), 150 (FIG. 1B), 200 (FIG. 2A) or 250 (FIG. 2B). During this method, the optical signal is received and amplified using the SOA (operation 810), which is configured as the gain medium. Then, the optical signal is optically coupled from the SOA to a first optical waveguide and a second optical waveguide (operation 812). Moreover, a portion of the optical signal is fed back to the SOA using the wavelength-selective reflector optically coupled to the first optical waveguide and the second optical waveguide (operation 814). Next, the remainder of the optical signal is output (operation 816), where the closed loop defined by the SOA, the first optical waveguide, the wavelength-selective reflector and the second optical waveguide defines the cavity of the laser source.

Figure 9:
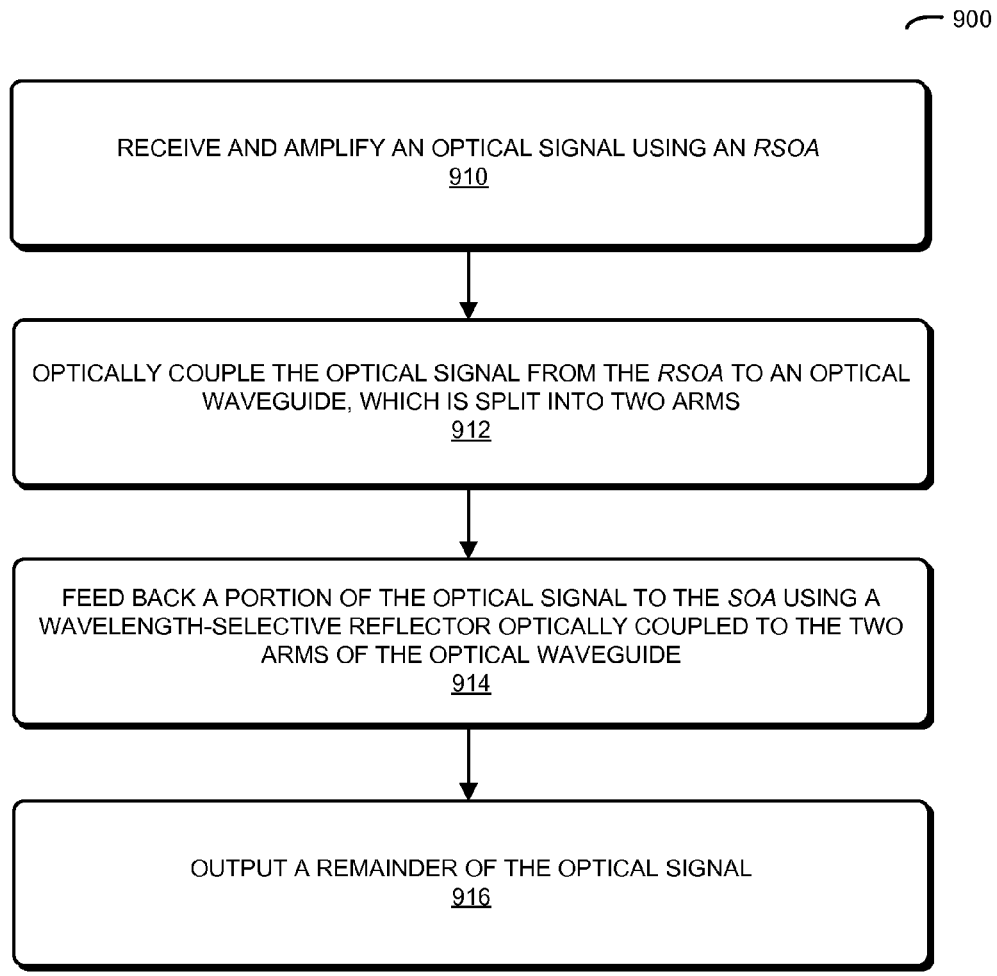
FIG. 9 is a flow chart illustrating a method for outputting an optical signal using the laser source of FIG. 3A or 3B in accordance with an embodiment of the present disclosure.

FIG. 9 presents a flow chart illustrating a method 900 for outputting the optical signal using laser source 300 (FIG. 3A) or 350 (FIG. 3B). During this method, the optical signal is received and amplified using the RSOA (operation 910), which is configured as the gain medium. Then, the optical signal is optically coupled from the RSOA to the optical waveguide (operation 912), which is split into two arms. Moreover, a portion of the optical signal is fed back to the RSOA using the wavelength-selective reflector optically coupled to the two arms of the optical waveguide (operation 914). Next, the remainder of the optical signal is output (operation 916), where the closed loop defined by the RSOA, the optical waveguide and the wavelength-selective reflector defines the cavity of the laser source.

Figure 10:
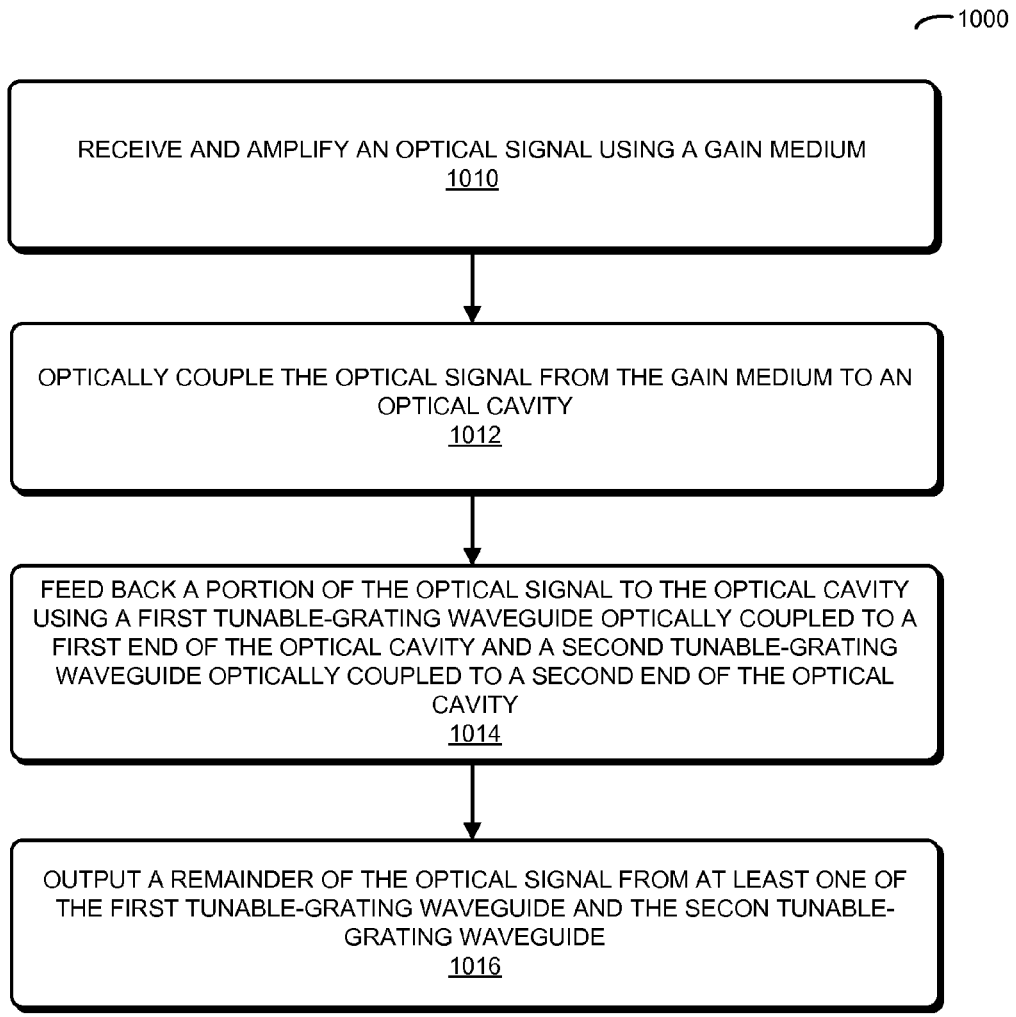
FIG. 10 is a flow chart illustrating a method for outputting an optical signal using the laser source of FIG. 4A or 4B in accordance with an embodiment of the present disclosure.

FIG. 10 presents a flow chart illustrating a method 900 for outputting the optical signal using laser source 400 (FIG. 4A) or 450 (FIG. 4B). During this method, a gain medium in the laser source receives and amplifies the optical signal (operation 1010). Then, the optical signal is optically coupled from the gain medium to an optical cavity in the laser source (operation 1012), which has a length exceeding a first predefined distance, wherein a wavelength spacing between optical modes associated with the optical cavity is less than a second predefined distance. Moreover, a portion of the optical signal is fed back to the optical cavity using a first tunable-grating waveguide in the laser source which is optically coupled to a first end of the optical cavity and a second tunable-grating waveguide in the laser source which is optically coupled to a second end of the optical cavity (operation 1014). Next, a remainder of the optical signal is output from at least one of the first tunable-grating waveguide and the second tunable-grating waveguide (operation 1016).

In some embodiments of methods 800 (FIG. 8), 900 (FIG. 9), and 1000, there may be additional or fewer operations. Moreover, the order of the operations may be changed, and/or two or more operations may be combined into a single operation.

While the preceding embodiments illustrate the use of the laser source in conjunction with an optical link, the laser source may be used in applications other than communications, such as: manufacturing (cutting or welding), a lithographic process, data storage (such as an optical-storage device or system), medicine (such as a diagnostic technique or surgery), a barcode scanner, entertainment (a laser light show), and/or metrology (such as precision measurements of distance).

The foregoing description is intended to enable any person skilled in the art to make and use the disclosure, and is provided in the context of a parti-cular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A laser source configured to output an optical signal characterized by at least a wavelength associated with a lasing mode of the laser source, comprising:
    a semiconductor optical amplifier (SOA) configured as a gain medium to receive and amplify the optical signal;
    a first optical waveguide optically coupled to the SOA;
    a second optical waveguide optically coupled to the SOA; and
    a wavelength-selective reflector optically coupled to the first optical waveguide and the second optical waveguide, wherein a closed loop defined by the SOA, the first optical waveguide, the wavelength-selective reflector and the second optical waveguide defines a cavity of the laser source.

2. The laser source of claim 1, wherein the wavelength-selective reflector includes a ring resonator.

3. The laser source of claim 1, wherein the wavelength-selective reflector includes two ring resonators having different sizes.

4. The laser source of claim 1, wherein the optical signal is output by the first optical waveguide and the second optical waveguide after the wavelength-selective reflector.

5. The laser source of claim 1, wherein the optical signal output by the laser source corresponds to a first beam that propagates clockwise around the closed loop and a second beam that propagates counterclockwise around the closed loop.

6. The laser source of claim 1, wherein the laser source further includes a bi-directional tap optically coupled to one of the first optical waveguide and the second optical waveguide; and
    wherein the optical signal is output by the bi-directional tap.

7. The laser source of claim 1, wherein the laser source further includes a phase-adjustment mechanism; and
    wherein the phase-adjustment mechanism is included in at least one of the first optical waveguide and the second optical waveguide.

8. The laser source of claim 7, wherein the phase-adjustment mechanism is configured to adjust a phase of the optical signal by thermally tuning an index of refraction of at least one of the first optical waveguide and the second optical waveguide.

9. The laser source of claim 1, wherein the laser source further includes a phase-adjustment mechanism; and wherein the phase-adjustment mechanism is configured to adjust a phase of the optical signal by injecting current into the SOA to change an index of refraction.

10. The laser source of claim 1, wherein the laser source is implemented on a single semiconductor substrate.

11. The laser source of claim 1, wherein the SOA is implemented on a first semiconductor substrate and a remainder of the laser source is implemented on a second semiconductor substrate; and wherein the laser source further includes an optical coupler optically coupling the SOA on the first semiconductor substrate and the remainder of the laser source on the second semiconductor substrate.

12. The laser source of claim 11, wherein the optical coupler includes an optical proximity coupler.

13. The laser source of claim 12, wherein the optical proximity coupler includes an etched mirror facet on the first semiconductor substrate and a grating coupler on the second semiconductor substrate.

14. The laser source of claim 11, wherein the remainder of the laser source is implemented using silicon-on-insulator technology on the second semiconductor substrate.

15. A method for outputting an optical signal using a laser source, wherein the optical signal is characterized by at least a wavelength associated with a lasing mode of the laser source, the method comprising:

receiving and amplifying the optical signal using a semiconductor optical amplifier (SOA) configured as a gain medium;

optically coupling the optical signal from the SOA to a first optical waveguide and a second optical waveguide;

feeding back a portion of the optical signal to the SOA using a wavelength-selective reflector optically coupled to the first optical waveguide and the second optical waveguide; and outputting a remainder of the optical signal, wherein a closed loop defined by the SOA, the first optical waveguide, the wavelength-selective reflector and the second optical waveguide defines a cavity of the laser source.

16. A laser source configured to output an optical signal characterized by at least a wavelength associated with a lasing mode of the laser source, comprising:

a reflective semiconductor optical amplifier (RSOA) configured as a gain medium to receive and amplify the optical signal;

an optical waveguide optically coupled to the RSOA, wherein the optical waveguide is split into two arms; and a wavelength-selective reflector optically coupled to the arms of the optical waveguide, wherein a closed loop defined by the RSOA, the optical waveguide, and the wavelength-selective reflector defines a cavity of the laser source.

17. The laser source of claim 16, wherein the wavelength-selective reflector includes a ring resonator.

18. The laser source of claim 16, wherein the wavelength-selective reflector includes two ring resonators having different sizes.

19. The laser source of claim 16, wherein the optical signal is output by the arms of the optical waveguide after the wavelength-selective reflector.

20. The laser source of claim 16, wherein the laser source further includes a bi-directional tap optically coupled to the optical waveguide; and wherein the optical signal is output by the bi-directional tap.

* * * * *